(12) United States Patent
Hasegawa (10) Patent No.: US 6,445,033 B1
(45) Date of Patent: Sep. 3, 2002

(54) GATE-INSULATING FILM INCLUDING OXIDE FILM

(75) Inventor: Eiji Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/609,290

(22) Filed: Jun. 30, 2000

(30) Foreign Application Priority Data

Jun. 30, 1999 (JP) ............................................ 11-184967

(51) Int. Cl.[7] .......................................... H01L 21/8228
(52) U.S. Cl. ...................... 257/324; 257/368; 257/406; 257/410
(58) Field of Search ................................ 257/324, 327, 257/349, 368, 369, 405, 406, 410, 411; 438/216, 261, 287, 591

(56) References Cited

U.S. PATENT DOCUMENTS 6,246,095 B1 * 6/2001 Brady et al. ................ 257/411
6,277,681 B1 * 8/2001 Wallace et al. ............. 438/198

FOREIGN PATENT DOCUMENTS

| JP | 7-231088 | 8/1995 |
| JP | 02000174275 A | * 6/2000 |

* cited by examiner

Primary Examiner—Olik Chaudhuri
Assistant Examiner—Hoai Pham
(74) Attorney, Agent, or Firm—McGinn & Gibb, PLLC (57) ABSTRACT

A gate-insulating film of the present invention is a gate-insulating film having a polycrystalline film made of a metal oxide, in which a grain boundary plane extending in parallel with the polycrystalline film is present at the position of a predetermined thickness of the polycrystalline film and grain boundaries extending in the film-thickness direction of polycrystals configuring the polycrystalline film are discontinuous at the grain boundary plane.

6 Claims, 6 Drawing Sheets

GATE-INSULATING FILM INCLUDING OXIDE FILM

BACKGROUND OF THE INVENTION

1. Field of the Invention

The present invention relates to a gate-insulating film of an MIS-type field-effect transistor or the like and its forming method, particularly to a gate-insulating film having a polycrystalline film made of a metal oxide and its forming method.

2. Description of the Prior Art

In development of a semiconductor device, it is one of the most important problems how to form a gate-insulating film of an MIS-type field-effect transistor at a high reliability and a high controllability. In case of a recent logic-based MIS (metal-insulating-film-semiconductor)-type device, the thickness of a gate-insulating film of a transistor rapidly decreases and an oxide film having a thickness of 3.0 nm or less is used. A silicon oxide film has been used up to now because of a relatively simple process as compared with other processes that the film can be formed by heat-treating a silicon substrate in an oxygen atmosphere in addition to its preferable insulating characteristic and interfacial characteristic. However, when the thickness of the film decreases from 5.0 nm to 4.0 nm or less, a phenomenon having been latent so far is actualized and becomes an obstacle for obtaining a device characteristic same as ever. For example, the phenomenon appears when leak current of a gate-insulating film increases. In case of a silicon oxide film having a low relative permittivity, it is impossible to control tunneling electrons at the time of reducing the thickness of the film.

To reduce the leak current, a method is known which uses a material having a higher relative permittivity as a gate-insulating film instead of a silicon oxide film. For example, Japanese Patent Laid-Open No. 7-231088 discloses an art of using a composite laminate film comprising one of materials having a high permittivity such as $Ta_2O_5$, $(Ba_{1-x}Sr_x)TiO_3$, and $PbZr_{1-x}TiO_3$ and a silicon oxide film having a thickness of 10 nm or less as an insulating film of a MIS-type field-effect transistor.

At the time of using one of these films having a high permittivity as a gate-insulating film, it is possible to increase the physical thickness of the gate-insulating film by a value equivalent to the high permittivity when equalizing the thickness of a silicon oxide film with the electrical film thickness of a dielectric, that is a film thickness converted into silicon-oxide-film thickness. Thus, an effect is obtained that the tunnel distance of an electron increases and a direct tunnel current, that is, a gate leak current does not easily flow.

However, to use a material having a high relative permittivity as a gate-insulating film, many problems must be solved. It is one of the big problems that these high-permittivity insulating films do not have a very large relative permittivity because they are amorphous when deposited and a process for performing a high-temperature treatment in an oxygen atmosphere after deposited is necessary. The influence of a high-temperature treatment on a high-permittivity film in an oxygen atmosphere is, of course, preferable. However, a silicon oxide film is formed on the lower side of a high-permittivity film, that is, on the silicon interface due to the high-temperature heat treatment in an oxygen atmosphere and makes it difficult to decrease the whole electrical thickness (converted into silicon-oxide-film thickness) of a gate-insulating film.

Figure 7:
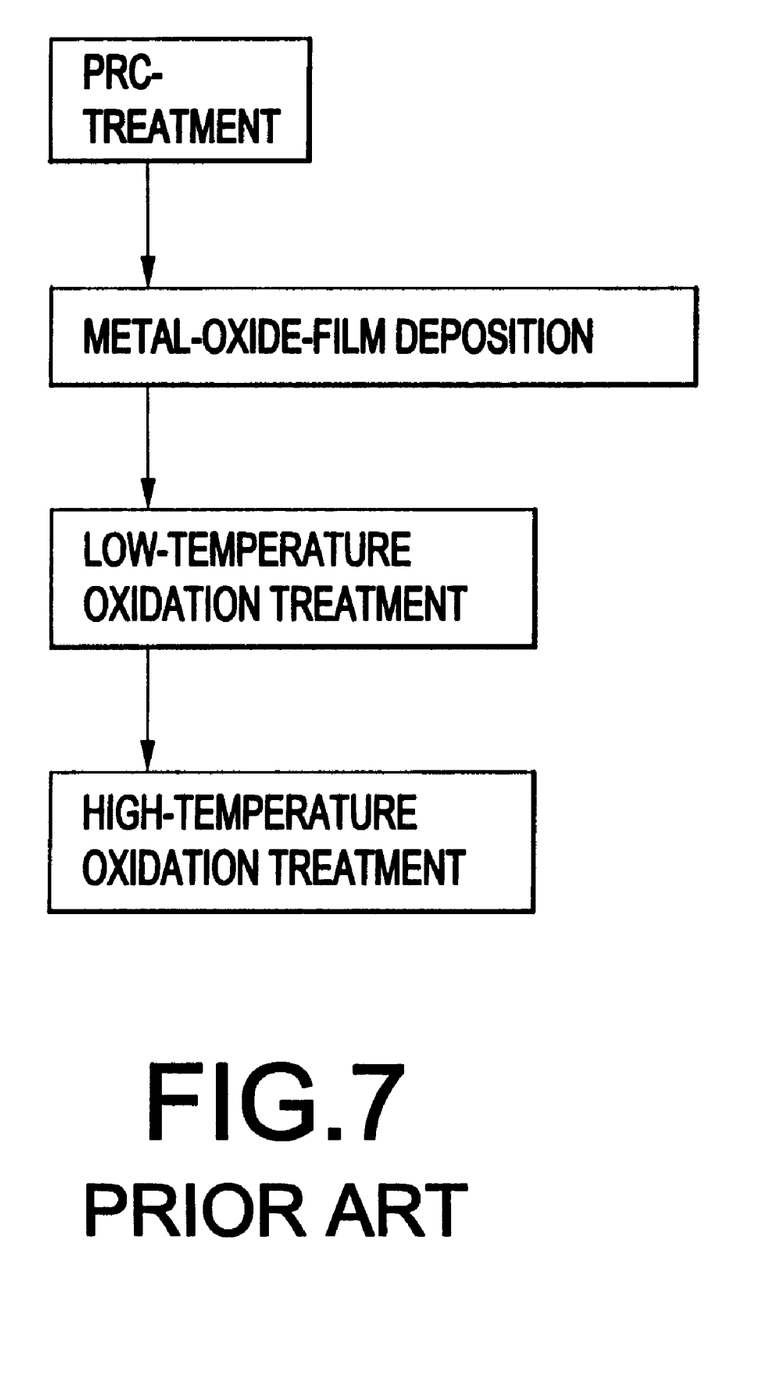
FIG. 7 is a flow chart showing a sequence of a process for forming a gate-insulating film of the prior art.

FIG. 7 roughly shows the sequence of a process for forming a high-permittivity gate-insulating film in accordance with a conventional method. In this case, a tantalum oxide film is used as a high-permittivity film. Surface purification (pretreatment 16) for forming a tantalum oxide film on a silicon substrate is performed and then the tantalum oxide film is deposited up to a desired thickness (metal oxide film deposition 26) through CVD. Then, a comparatively-low-temperature heat treatment (low-temperature oxidation treatment 36) is performed in an oxidizing atmosphere in order to introduce oxygen for reinforcement and finally, heat treatment is performed in an oxidizing atmosphere at a high temperature (high-temperature oxidation treatment 46). The final high-temperature oxidation treatment 46 is performed to make the tantalum oxide film polycrystalline and perform reinforcing oxidation. This polycrystallization makes it possible to reduce a gate leak current and improve a relative permittivity.

Figure 8A:
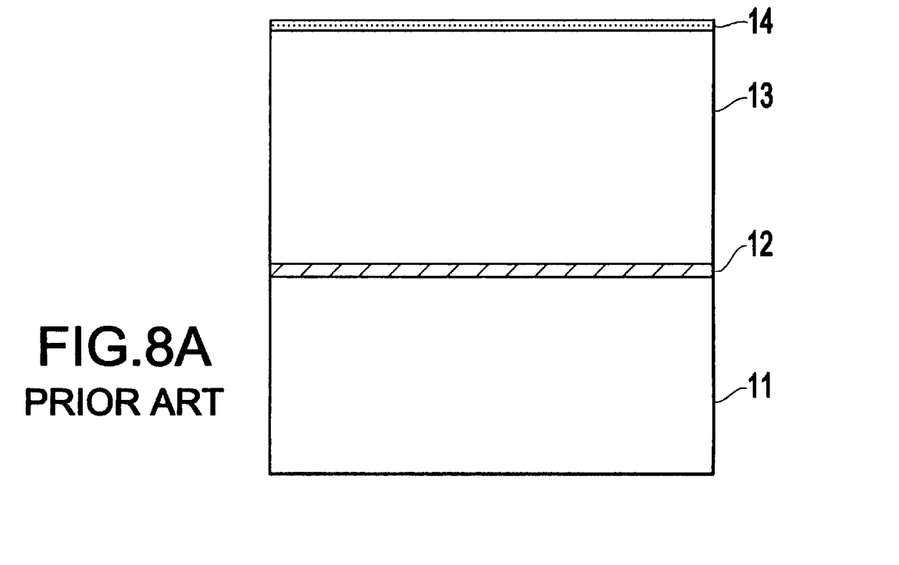
FIGS. 8A and 8B are schematic sectional views of a gate-insulating film of the prior art.
Figure 8B:
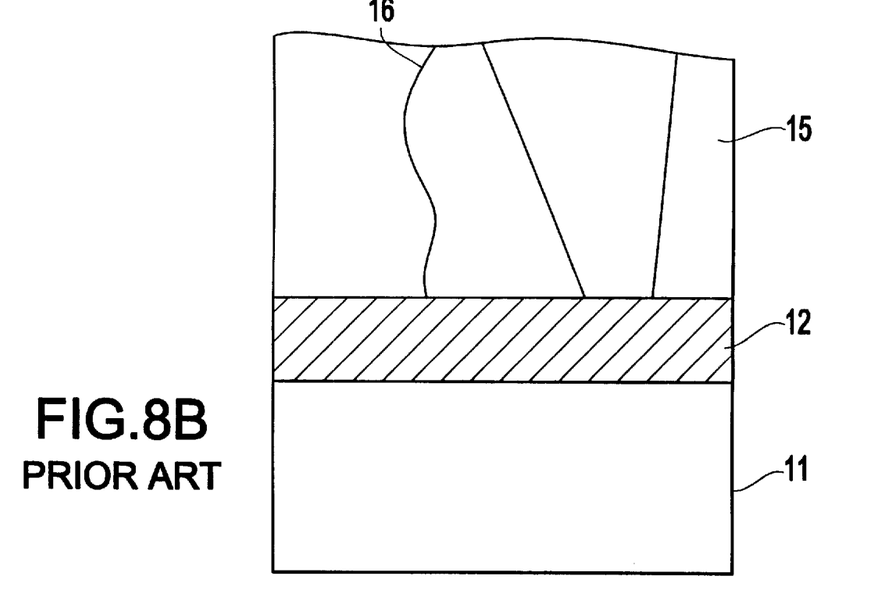

FIGS. 8A and 8B schematically show sectional views of the tantalum oxide film thus obtained on a silicon substrate 11. FIG. 8A shows a state immediately before the high-temperature oxidation treatment 46, in which a silicon oxide film 12 having a thickness of approx. 0.5 nm formed when an amorphous tantalum oxide film 13 is deposited on the silicon substrate 11, the amorphous tantalum oxide film 13, and an oxygen-rich amorphous tantalum oxide film 14 into which oxygen is additionally introduced through the low-temperature oxidation treatment 36 such as $UV/O_3$ treatment are superposed.

Then, by performing the high-temperature oxidation treatment 46, the tantalum oxide film is crystallized and a polycrystalline tantalum oxide film 15 is formed as shown in FIG. 8B. When a high-permittivity film is crystallized, it easily becomes columnar grains and a crystal is formed which becomes columnar in the film-thickness direction, that is, in which grain boundaries 16 are directly connected each other from the surface up to the silicon substrate.

A problem in this case is that the thickness of the silicon oxide film 12 increases and the thick silicon oxide film 12 is formed on the lower side of the high-permittivity film, that is, on the interface of the silicon substrate. Though crystallization occurs immediately when a high temperature is applied, a certain time is necessary for reinforcement oxidation of the tantalum oxide film. In this case, oxidation species in the atmosphere are diffused by passing through grain boundaries of the crystallized tantalum oxide film to reach the silicon substrate and directly oxidize the silicon substrate. For example, at the time of depositing a tantalum oxide film having a thickness of 8 nm, performing $UV/O_3$ treatment at 500° C. for 10 min and moreover performing heat treatment in a dry oxygen atmosphere at 800° C., the thickness of a silicon oxide film formed on the interface of the silicon substrate reaches approx. 3.5 nm.

The thickness of a high-permittivity film when used as a gate-insulating film instead of a silicon oxide film is just kept in a range of 3.0 nm or less. Therefore, a requested film thickness cannot be realized due to the 3.5-nm silicon oxide film unavoidably formed.

Of course, it is possible to control the thickness of the silicon oxide film at the interface by lowering the heat-treatment temperature. However, a relative permittivity is not increased as expected but a gate leak current increases. Moreover, grain boundaries directly extending in the film-thickness direction cause the gate leak current to increase.

BRIEF SUMMARY OF THE INVENTION

Objects of the Invention

It is an object of the present invention to provide a gate-insulating film comprising a polycrystalline film made of a metal oxide which has a high relative permittivity, controls a gate leak current to a completely small value, and has a small film thickness converted into silicon-oxide-film thickness (electrical film thickness) of the whole gate-insulating film because formation of a silicon oxide film is controlled at the interface of a silicon substrate and a gate-insulating film forming method.

SUMMARY OF THE INVENTION

A gate-insulating film of the present invention is a gate-insulating film having a polycrystalline film made of a metal oxide, wherein a grain boundary plane extending in parallel with a plane of the polycrystalline film is present at the position of a predetermined thickness of the polycrystalline film and grain boundaries extending in the film-thickness direction of polycrystals configuring the polycrystalline film are discontinuous on the grain boundary plane.

Moreover, another gate-insulating film of the present invention is a gate-insulating film having a polycrystalline film made of an oxide, wherein the polycrystalline film has a laminate structure of polycrystalline layers polycrystallized after amorphous layers made of an oxide are independently superposed each other and grain boundaries extending in the thickness direction of polycrystalline layers adjacent each other in the film thickness direction are discontinuous each other.

Still another gate-insulating film of the present invention is a gate-insulating film having a polycrystalline film made of oxide, wherein the polycrystalline film has a structure in which the grain size of the film in the thickness direction of a layer is equal to an average grain size in a direction parallel with the layer, a plurality of polycrystalline layers respectively having a thickness equal to a grain size in the layer-thickness direction are superposed each other, grain boundaries extending in the thickness direction of polycrystalline layers adjacent each other in the layer thickness direction are discontinuous.

A gate-insulating-film forming method of the present invention is a method for forming a gate-insulating film containing a metal oxide, wherein, at the time of defining two consecutive steps such as the step of forming an amorphous layer made of a metal oxide on a semiconductor substrate and the step of oxidizing the amorphous layer at a first temperature in an atmosphere containing oxygen as one cycle, the step of crystallizing the amorphous layer by heat-treating the layer at a second temperature equal to or higher than the first temperature after executing the consecutive steps by at least two cycles is included.

Another gate-insulating-film forming method of the present invention is a method for forming a gate-insulating film made of a metal oxide, wherein the following steps are included: the step of forming a first amorphous layer made of a metal oxide on a semiconductor substrate, the step of forming a second amorphous layer containing oxygen more than the case of the first amorphous layer on the first amorphous layer, the step of forming a third amorphous layer containing oxygen less than the case of the second amorphous layer on the second amorphous layer, and the step of heat-treating the first, second, and third amorphous layers and polycrystallizing them.

According to the above present invention, an amorphous film made of a metal oxide is separated into several layers through the low-temperature oxidation treatment performed while the metal-oxide amorphous film is formed. Each separated amorphous film is simultaneously and independently crystallized through comparatively-high-temperature heat treatment to be performed later at each layer. Therefore, it is possible to decrease the grain size of the crystal of a metal-oxide polycrystalline film.

Decrease of grain size has not only an advantage of controlling the dispersion of characteristics of a high-permittivity film in a wafer plane but also an advantage of controlling a gate leak current. The largest advantage is that it is possible to divide the grain boundary of each layer by dividing grains of a crystalline tantalum-oxide film at each layer and decrease the number of oxidation species reaching a silicon interface at the time of high-temperature oxidation treatment. As a result, it is possible to control the formation of a silicon oxide film (relative permittivity of 3.9) having a relative permittivity lower than a high-permittivity film and form a laminate-type high-permittivity film having a very high relative permittivity as the whole of a gate-insulating film. In other words, it is possible to form a high-permittivity film having a very small thickness converted into silicon-oxide-film thickness.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
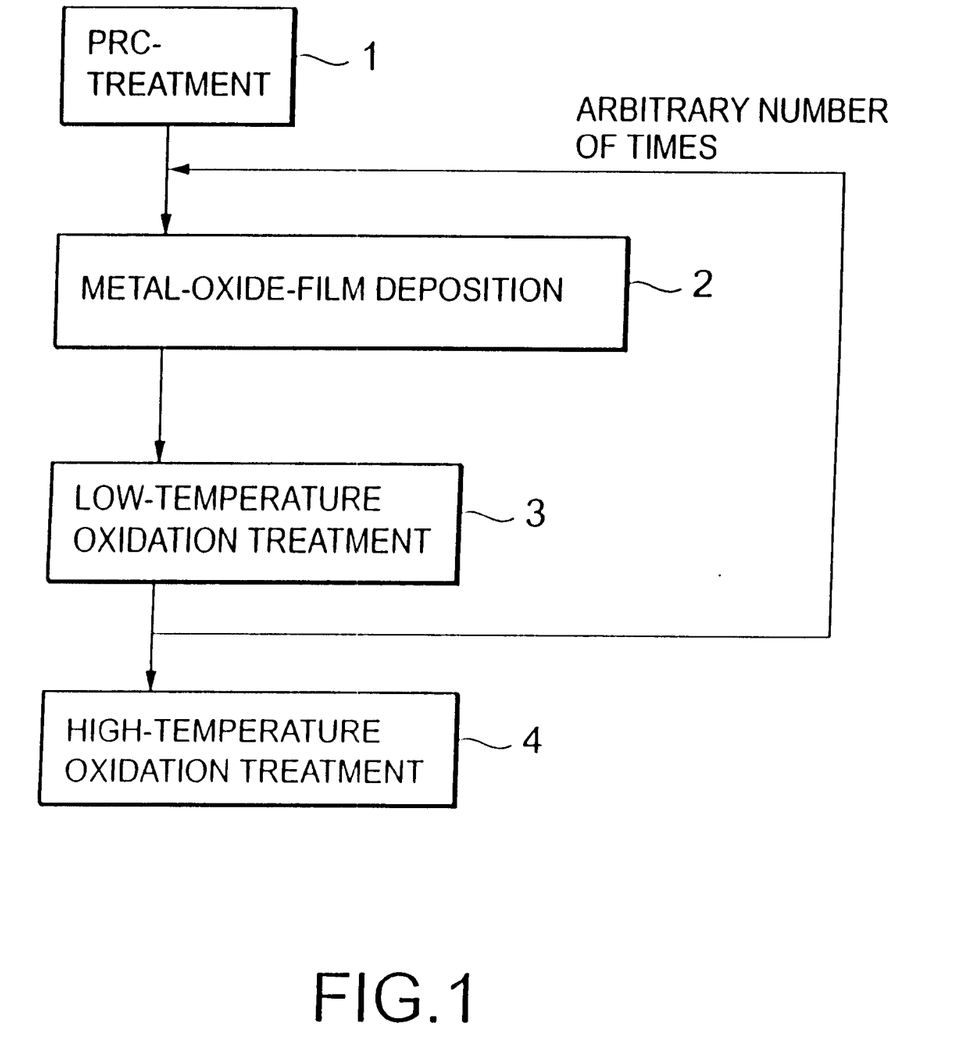
FIG. 1 is a flow chart showing a sequence of a process for forming a gate-insulating film of an embodiment of the present invention.

FIG. 1 is a flow chart showing a process sequence of an embodiment of a gate-insulating-film forming method of the present invention. A tantalum oxide film will be described below as a high-permittivity film.

First, a pre-treating step 1 of cleaning a silicon substrate is executed before forming a tantalum oxide film serving as a gate-insulating film. In general, cleaning using a cleaning solvent obtained by mixing an ammonium solution with a hydrogen-peroxide solution referred to as SC1 and cleaning using a chemical solution obtained by mixing hydrochloric acid with a hydrogen-peroxide solution referred to as SC2 are continuously performed in order to expose a cleaning surface by removing heavy-metal contamination, organic-matter contamination, and particles from the surface of a silicon substrate. Then, the substrate is soaked in a hydrofluoric-acid solution diluted by demineralized water in order to remove a very-thin silicon natural oxide film formed through the above types of cleaning.

Then, these pre-treatments are performed to execute a metal-oxide-film depositing step 2 of depositing a tantalum oxide film on the substrate surface. For example, a film is formed by a physical film thickness of 2.0 nm through low-pressure CVD at a low pressure of approx. 400 mTorr and 450° C. by using a mixed gas of pentaethoxytantalum of a liquid source and oxygen gas. In this case, the tantalum oxide film is amorphous and it is not crystallized yet.

Then, oxidation is performed at a comparatively low temperature. For example, a sample is heated by applying UV light (ultraviolet light) in an ozone-gas atmosphere. Ozone gas of 10 lit per min is supplied to perform treatment at a temperature of 300 to 550° C. for 10 min. It is preferable to perform the treatment at 500° C. This type of a low-temperature oxidation treatment step 3 is normally executed to additionally supply oxygen atoms, which are slightly insufficient, only by tantalum-oxide-film deposition in the preceding step. In this case, an area of oxygen-rich amorphous tantalum containing much oxygen compared to the case under bulking is formed nearby the surface of the amorphous tantalum oxide film deposited in the preceding step.

Then, at the time of defining the metal-oxide-film depositing step 2 using pentaethoxytantalum and the low-temperature oxidizing step 3 using ozone gas as one cycle, the cycle is repeated until a desired physical film thickness is obtained. For example, to form a tantalum oxide film having a physical film thickness of approx. 8.0 nm, a cycle of deposition of 2.0 nm and low-temperature ozone treatment is repeated four times.

After the desired film thickness is obtained, the high-temperature oxidizing step for crystallizing the tantalum oxide film that is still amorphous is executed as the final step for forming the tantalum oxide film. In the high-temperature oxidizing step, comparatively-high-temperature heat treatment is performed in an oxygen atmosphere. For example, by performing heat treatment in a dry-oxygen atmosphere by a virtical diffusion furnace at 500 to 900° C., preferably 800° C. for 10 min, a completely-crystallized tantalum oxide film is obtained and a tantalum oxide film serving as a gate-insulating film is completed.

An embodiment of the present invention will be more minutely described below by referring to the accompanying drawings. FIGS. 2A to 2D show sectional structures of the above-described gate-insulating film having a tantalum oxide film formed in the process sequence step in FIG. 1 in order of process sequence.

Figure 2A:
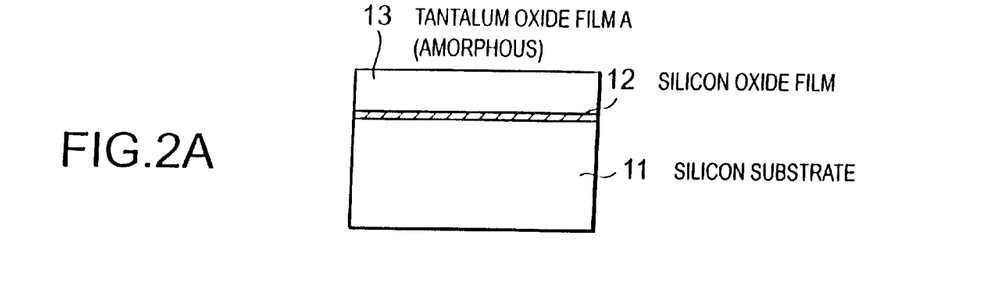
FIGS. 2A to 2D are schematic step sectional views of a process for forming a gate-insulating film of an embodiment of the present invention.

FIG. 2A is a sectional view showing a state in which the first-time tantalum-oxide-film depositing step is applied onto the silicon substrate 11 cleaned by performing pre-treatment 1 and the amorphous tantalum oxide film (tantalum oxide film A) 13 is deposited up to 2.0 nm. The silicon-substrate surface 11 from which a natural oxide film is removed through the pre-treatment 1 is very active. Therefore, the surface 11 is oxidized by oxygen gas intro-duced when depositing the tantalum oxide film 13 (tantalum oxide film A) even at a low temperature of 450° C. and a silicon oxide film 12 having a thickness of 0.5 nm is formed.

Figure 2B:
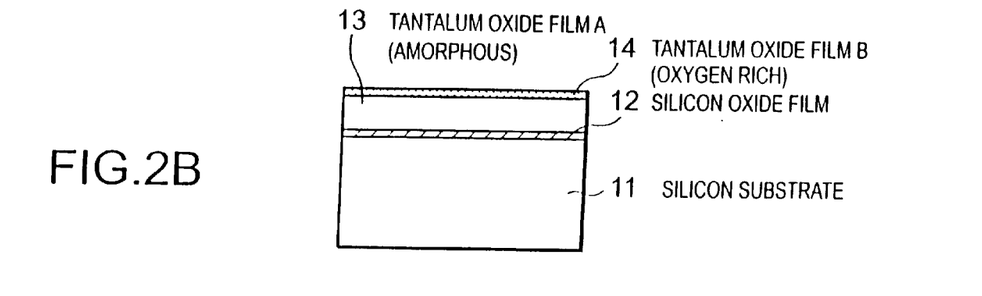

FIG. 2B shows a cross section immediately after performing low-temperature oxidation treatment in an ozone atmosphere as the low-temperature oxidation treatment 3. A tantalum oxide film B14 becoming oxygen-rich because a part of a tantalum oxide film A is deteriorated and oxygen is sufficiently supplied is formed on the surface of the tantalum oxide film A13.

Figure 2C:
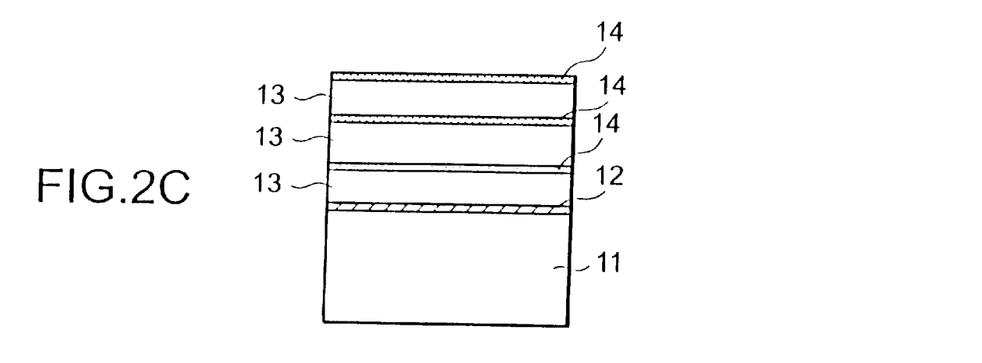

FIG. 2C is a sectional view after process steps of the metal-oxide-film deposition 2 and low-temperature oxidation treatment 3 are repeated three times. A seven-layer structure is completed in which the amorphous tantalum oxide film A and oxygen-rich tantalum oxide film B are superposed on the thin silicon oxide film 12 at the interface of the silicon substrate. In this case, the thickness of the oxygen-rich tantalum oxide film B is very small and the composition of the film B is only slightly different from that of the tantalum oxide film A. However, because the layer of the film B is formed, tantalum oxide films become discontinuous in the film-thickness direction. The effect appears in a comparatively-high-temperature heat treatment of the next high-temperature oxidizing step 4.

Figure 2D:
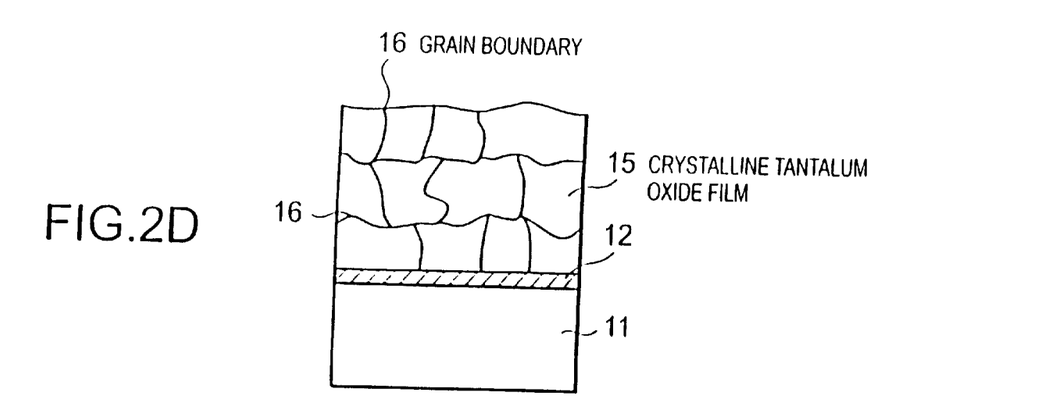

FIG. 2D is a sectional view after the high-temperature oxidation treatment 4. By performing heat treatment at a high temperature of approx. 800° C., an amorphous tantalum oxide film is crystallized. Crystallization is instantaneously progressed. However, because a grain after crystallized uses the size of the tantalum oxide film A13 having been present at amorphous state as the basic unit, the thickness of the film 13 is almost restricted to the thickness of one-time tantalum oxide film deposition.

Though the tantalum oxide film B is also crystallized and its quality becomes almost equal to that of the tantalum oxide film A, an initial deposition state (structure in FIG. 2C) influences the quality. As a result, the crystalline tantalum oxide film 15 is formed which is separated almost into three layers though irregularity is slightly produced depending on a state in which grains are produced. In this case, it is characteristic that positions of the grain boundaries 16 running in the film-thickness direction depend on each layer and therefore, the boundaries 16 are not continuously connected in the film-thickness direction.

Figure 3:
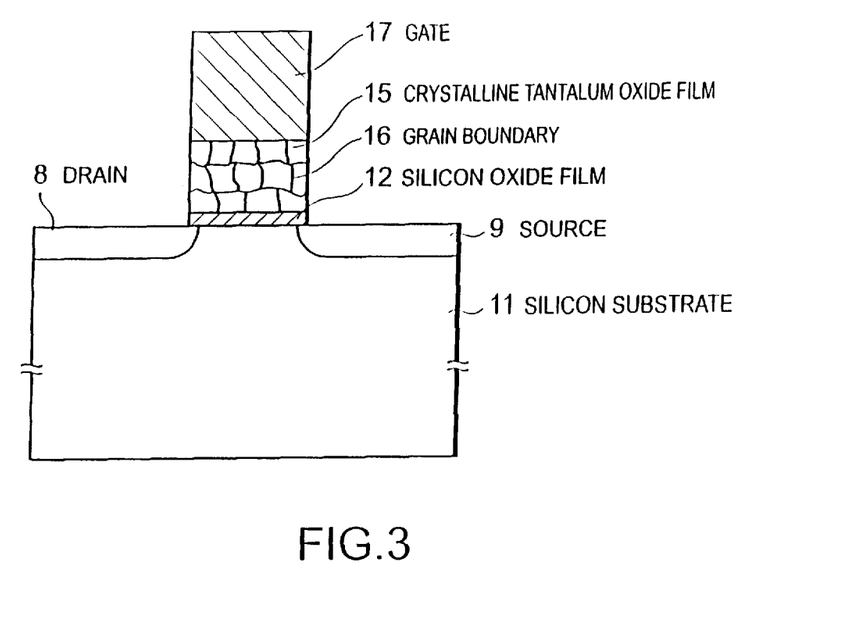
FIG. 3 is a schematic sectional view of an MIS-type field effect transistor having a gate-insulating film of an embodiment of the present invention.

FIG. 3 schematically shows a sectional view of a typical MIS-type field-effect transistor formed after obtaining a gate-insulating film comprising the crystalline tantalum oxide film 15 and silicon oxide film 12 in the above-described manner. A gate electrode 17 made of a conductive material is formed on the crystalline tantalum oxide film 15 and a drain region 18 and a source region 19 are formed on the silicon substrate 11.

In the step of forming a gate-insulating film having a metal oxide film, the main purpose of the high-temperature oxidation treatment 4 is crystallization of an amorphous tantalum oxide film and reinforcing oxidation of a tantalum oxide film. Therefore, as described above, heat treatment is normally performed in an oxidizing atmosphere. In case of the prior art, an oxidation species pass through grain boundaries, reach a silicon substrate, and react with the silicon substrate, and resultantly the thick silicon oxide film 12 is formed. In the case of the present invention, however, because grain boundaries are not connected in the film-thickness direction, oxidation species are prevented from diffusing up to the interface of the silicon substrate and thus, it is possible to control formation of a silicon oxide film.

For example, according to the above film forming conditions, the 0 5-nm silicon oxide film 12 formed when the tantalum oxide film A13 serving as a first layer initially present is formed increases up to 2.3 nm in film thickness. However, the degree of increase of the film thickness is remarkably reduced compared to the film thickness of 3.5 nm in case of the above-described prior art.

Figure 4:
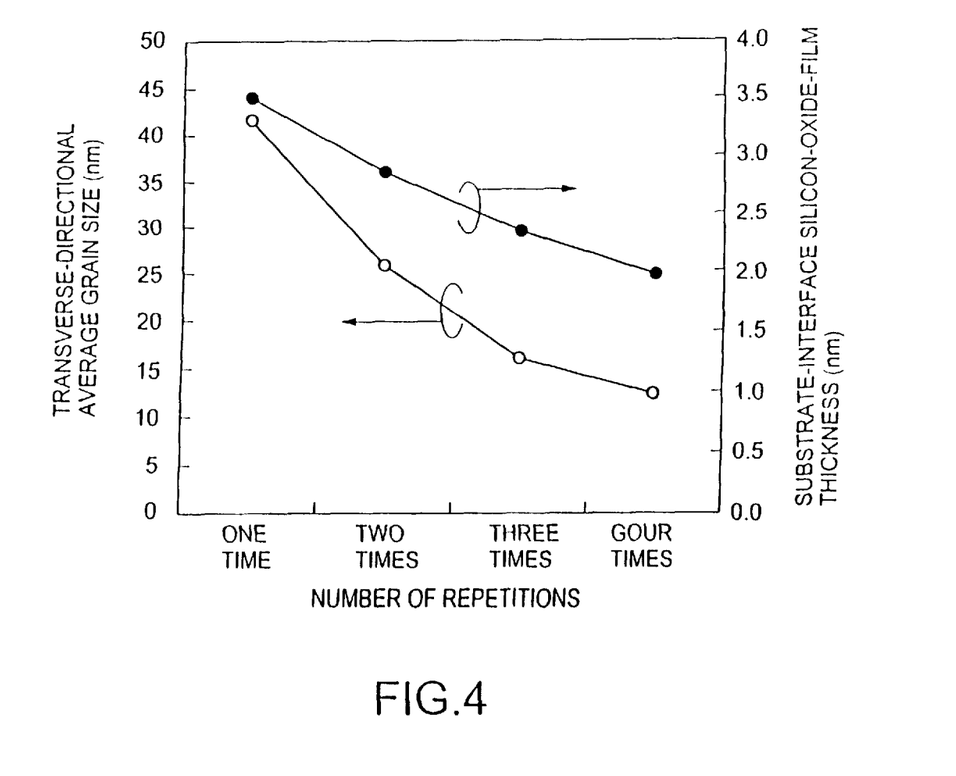
FIG. 4 is an illustration showing the relation between transverse-directional average grain size, substrate-interface silicon-oxide-film thickness, and number of repetitions of steps of explaining the present invention.

The above effect is clearly shown in FIG. 4. FIG. 4 shows a result of examining transverse-directional average grain size and thickness of silicon oxide film formed on the interface of silicon substrate when fixing the final thickness of a tantalum oxide film to 8.0 nm and changing the number of repetitions of one cycle of tantalum oxide film deposition and ozone low-temperature heat treatment from 1 to 4.

When the number of repetitions is equal to 1, the prior art is used in which a tantalum oxide film is simply deposited up to 8.0 nm and low-temperature heat treatment is performed. When the number of repetitions is equal to 2, a tantalum oxide film is deposited up to 4.0 nm and two cycles are performed. Similarly, three repetitions represent that deposition of approx. 2.6 nm and low-temperature heat treatment are repeated and four repetitions represent repetitions of deposition of 2.0 nm.

The transverse-directional average grain size of the left vertical axis denotes an average size of crystals of a tantalum oxide film measured at the time of viewing a sample not from the film thickness direction but from the upper side of the sample, that is, measured in the transverse direction parallel with the film plane. It is needless to say that the film-thickness-directional grain size is almost equal to the size equivalent to one time of repeated deposition of a tantalum oxide film.

FIG. 4 shows a state in which a grain size decreases and the thickness of the silicon oxide film on a substrate also decreases as the number of repetitions increases. The thickness of the silicon oxide film 12 decreases to approx. 2.0 nm from the conventional thickness of approx. 3.5 nm. Control of the interface silicon oxide film results in the fact that a film thickness converted into silicon-oxide-film thickness observed at the time of viewing a gate-insulating film as the whole. Of course, because it is a purpose to form a thin high-permittivity film having a thickness converted into silicon-oxide-film thickness, it is preferable to decrease the total thickness.

Figure 5:
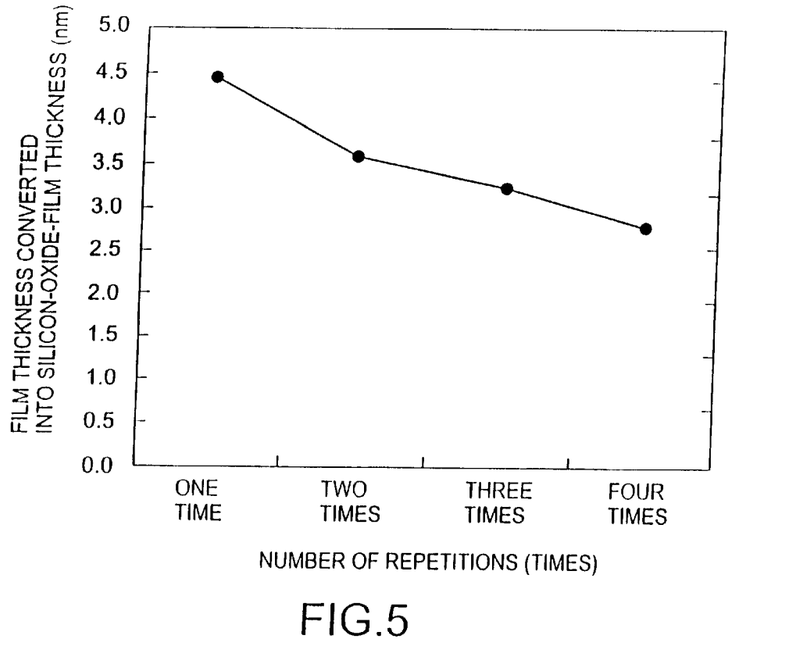
FIG. 5 is an illustration showing the relation between thickness converted into silicon-oxide-film thickness and number of repetitions of steps of explaining the present invention.

FIG. 5 shows the relation between number of repetitions and film thickness converted into silicon-oxide-film thickness. Because tantalum oxide films to be formed are almost the same and relative permittivities are also almost the same, a film thickness converted into silicon-oxide-film thickness calculated by only the portion of a tantalum oxide film is equal to approx. 0.9 nm in any condition in this case (relative permittivity is equal to approx. 34). That is, the fact that the total film thickness converted into silicon-oxide-film thickness is decreased by increasing the number of repetitions can be understood as the fact that a silicon oxide film formed on the interface of a silicon substrate can be controlled as shown in FIG. 4.

In case of the prior art, it is impossible to form a film having a small thickness converted into silicon-oxide-film thickness. However, the present invention makes it possible to decrease a film thickness from 4.5 nm up to approx. 2.7 nm.

The effect that grain boundaries are not continued in the film thickness direction also appears in reduction of a gate leak current. A current in a tantalum oxide film originally includes many hopping current components through levels. Moreover, most of the levels are easily produced on grain boundaries. Therefore, it is necessary to decrease the number of grain boundaries. In this case, decrease of a grain size by the present invention results in increase of the number of grain boundaries and may increase a gate leak current. At the time of using a single-layer tantalum oxide film in another experiment, it is exactly confirmed that a leak current increases as a grain size decreases.

In case of the present invention, however, though a grain size decreases and the number of boundaries increases, a film-thickness-directional grain boundary does not directly connect a gate electrode with a silicon substrate. Therefore, the effect has a relatively large influence and a gate leak current decreases.

Figure 6:
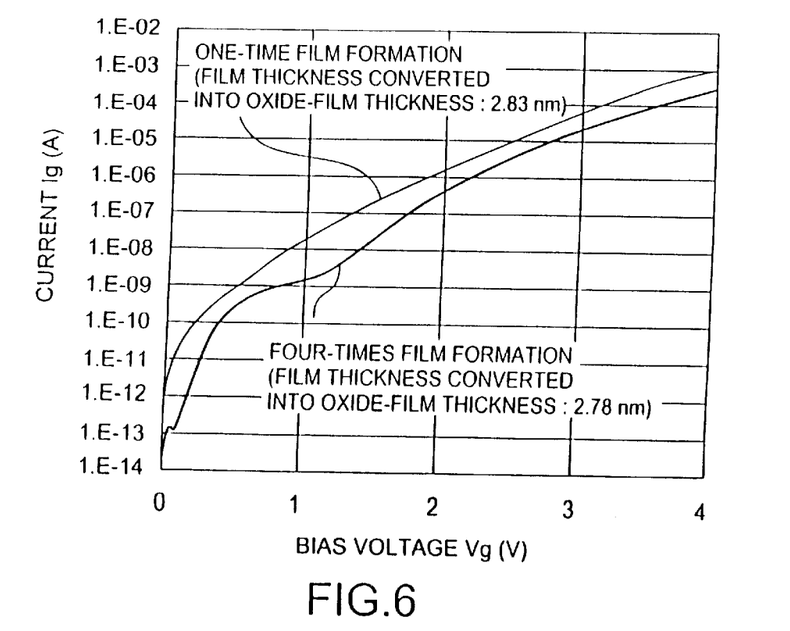
FIG. 6 is an illustration showing the relation between gate current and gate bias voltage for explaining a gate leak current of an embodiment of the present invention.

FIG. 6 is an example of the above phenomenon, which shows a result of depositing titanium nitride (TiN) on a gate tantalum oxide film formed on an n-type silicon substrate as an electrode and measuring current and voltage characteristics. The electrode has an area of $1E-4$ cm$^2$. In this case, a film thickness converted into silicon-oxide-film thickness obtained as a result is adjusted to approx. 2.8 nm for comparison. Moreover, to further control formation of silicon oxide films on an interface as much as possible, the temperature for high-temperature heat treatment is lowered to 600° C. from the above 800° C. Under the above condition, thicknesses of both silicon oxide films formed on an interface are almost equal to each other. That is, it is possible to purely observe a difference between grain boundaries (sizes). FIG. 6 clearly shows that a gate leak current in four-time film formation is smaller than that in one-time film formation. That is, it is represented that a high-permittivity film having a high insulating characteristic can be formed by the present invention.

Moreover, about a gate leak current, it is known that temperature for high-temperature heat treatment is better in a range of up to 900° C. In case of the above embodiment, 800° C. is used. Furthermore, larger relative permittivity is obtained as temperature rises. However, when temperature exceeds 800° C., the thickness of the silicon oxide film 12 on the interface with a substrate increases up to a value that cannot be ignored.

Thoughtlessly lowering a heat-treatment temperature in order to control a silicon oxide film formed on the interface of a silicon substrate is disadvantageous from the viewpoint of a leak current and the viewpoint of obtaining a high relative permittivity and decreasing a converted film thickness. After all, high-temperature heat treatment of a metal oxide is necessary. At the time of performing high-temperature heat treatment, the present invention displays a superior advantage.

An embodiment of the present invention is described above. In case of the present invention, however, it is one of the large features to divide formation of a tantalum oxide film and a remarkable advantage is obtained by defining the tantalumoxide-film depositing step and the low-temperature oxidizing step as one cycle and repeating the cycle. That is, the process flow, structure, and shape shown for the above embodiment are used to understandably explain the present invention but the present invention is not restricted to the film thickness, forming condition, and numerical value of each component.

For example, in case of the above embodiment, the tantalum oxide film A13 has a very small thickness of 2 nm and when the film A13 is crystallized by undergoing the high-temperature oxidation treatment 4, a single crystal is formed over the whole thickness of 2 nm in the thickness direction. However, by further increasing the thickness of a metal oxide film formed through the metal-oxide-film depositing step 2 and the low-temperature oxidation treatment 3 for one cycle or moderating conditions for high-temperature oxidation treatment, it is permitted to form a plurality of polycrystals in a metal-oxide film formed for one cycle in its thickness direction.

Moreover, as for the above embodiment, CVD using an organic tantalum material gas (pentaethoxytantalum) to form a tantalum oxide film is described. However, even if CVD using $TaC_{15}$ or $TaF_5$ or a forming method conforming to the sputtering theory using a Ta target is used, the effect of the present invention is not changed because heat treatment is indispensable.

Furthermore, a treatment immediately before tantalum oxide film deposition is described as a pre-treatment. However, the present invention is also effective at the time of forming a very-thin nitride film (for example, a thickness of 0.5 nm) in ammonium gas by using a ramp annealing system immediately before depositing a tantalum oxide film. Because the nitride film has a characteristic capable of controlling diffusion of oxidation species, it is possible to control oxidation of a silicon substrate to a certain extent when a tantalum oxide film is deposited or high-temperature heat treatment is performed but the control is not complete. It is needless to say that the present invention is effective for control of further formation of interface silicon oxide films.

Moreover, a tantalum oxide film ($Ta_2O_5$) is described above as a high-permittivity insulating film. However, the present invention has a sufficient effect as compared with the prior art as long as a high-permittivity material having a relative permittivity of 7.0 or more is used. For example, the present invention is effective for an insulating film using $TiO_2$, and Ba, Sr, Ti, and O as basic elements referred to as BST, an insulating film using Pb, Zr, Ti, and O as main elements referred to as PZT, and an aluminum oxide film ($Al_2O_3$) and is not restricted to each film forming condition. That is, all of these high-permittivity insulating films are amorphous when formed and high-temperature post-treatment is necessary in order to increase a relative permittivity. Because each high-permittivity film is crystallized through the high-temperature treatment, it is possible to directly use the present invention.

As described above, the present invention makes it possible to control oxidation of a silicon substrate during the high-temperature heat treatment for crystallization that is the final treatment. That is, it is possible to increase the ratio of insulating films having a high relative permittivity and decrease a film thickness converted into silicon-oxide-film thickness. Inversely, the above mentioned is directly effective to control a gate leak current by increasing a physical film thickness even for the same thickness converted into silicon-oxide-film-thickness, which is the maximum purpose for using a high-permittivity film as a gate-insulating film.

Moreover, from a different viewpoint, it is possible to decrease a film thickness converted into silicon-oxide-film thickness at the time of performing comparison at the same gate-leak-current level. This results in the fact of obtaining much drain current at the time of comparing transistors having the same power-supply voltage. That is, it is possible to use a high-permittivity film consuming a small leak current and having a high reliability as a gate-insulating film of a transistor and fabricate a semiconductor device including a high-speed, high-performance, and high-reliability MIS-type field effect transistor.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A gate-insulating film having a polycrystalline film made of a metal oxide, wherein a grain boundary plane extending in parallel with a plane of said polycrystalline film is present at a position of a predetermined thickness of said polycrystalline film and grain boundaries extending in film-thickness directions of polycrystals configuring said polycrystalline film are discontinuous on said grain boundary plane.

2. The gate-insulating film according to claim 1, wherein said oxide is a tantalum oxide.

3. A gate-insulating film including a silicon oxide film formed on a silicon substrate and a polycrystalline film made of an oxide formed on said silicon oxide film, wherein said polycrystalline film has a laminate structure of polycrystalline layers polycrystallized after a plurality of amorphous layers made of said oxide are superposed and grain boundaries extending in said layer-thickness direction of said polycrystalline layers adjacent to each other in said layer-thickness direction are discontinuous with each other, wherein said oxide is a tantalum oxide having a relative permittivity of 7.0 or more and said gate-insulating film has a thickness converted into silicon-oxide-film thickness of 5.0 nm or less.

4. A gate-insulating film including a polycrystalline film made of an oxide, wherein said polycrystalline film has a laminate structure of polycrystalline layers polycrystallized after a plurality of amorphous layers made of said oxide are independently superposed and grain boundaries extending in said layer-thickness direction of said polycrystalline layers adjacent to each other in said layer-thickness direction are discontinuous with each other, wherein said oxide is a tantalum oxide.

5. A gate-insulating film including a polycrystalline film made of an oxide, wherein said polycrystalline film has a layer-thickness-directional grain size equal to an average grain size in a direction parallel with a layer and has a structure in which a plurality of polycrystalline layers whose thickness is equal to said layer-thickness-directional grain size, and grain boundaries extending in said layer-thickness direction of said polycrystalline layers adjacent to each other in said layer-thickness direction are discontinuous with each other, wherein said oxide is a tantalum oxide.

6. A gate-insulating film including a silicon oxide film formed on a silicon substrate and a polycrystalline film made of an oxide formed on said silicon oxide film, wherein said polycrystalline film has a laminate structure of polycrystalline layers polycrystallized after a plurality of amorphous layers made of said oxide are superposed and grain boundaries extending in said layer-thickness direction of said polycrystalline layers adjacent to each other in said layer-thickness direction are discontinuous with each other, wherein said oxide is a tantalum oxide.

* * * * *